United States Patent [19]

Jackson et al.

[11] Patent Number: 5,347,123
[45] Date of Patent: Sep. 13, 1994

[54] OPTICAL CONTROL SWITCH DEVICE HAVING A PLURALITY OF LIGHT RECEPTORS

[75] Inventors: Gregory D. Jackson, Sunrise; David E. Reiff; Mac W. Branan, both of Ft. Lauderdale, all of Fla.

[73] Assignee: Motorola, Inc., Schaumburg, Ill.

[21] Appl. No.: 57,377

[22] Filed: May 6, 1993

[51] Int. Cl.⁵ .............................................. G01D 5/34
[52] U.S. Cl. ..................... 250/229; 250/227.22; 340/555
[58] Field of Search ............... 250/229, 221, 231.13, 250/214 PR, 227.22; 340/539, 546, 555, 556, 870.08

[56] References Cited

U.S. PATENT DOCUMENTS 3,610,941 10/1971 West.
4,015,253  3/1977 Goldstein.
4,480,183 10/1984 Ely et al. ...................... 250/227.22
4,631,399 12/1986 Wood ................................ 250/221
4,634,861  1/1987 Ching et al.

*Primary Examiner*—David C. Nelms
*Assistant Examiner*—Que T. Le
*Attorney, Agent, or Firm*—Lesley A. Rhyne; Andrew S. Fuller

[57] ABSTRACT

An optical rotary control device (10) is provided comprising a light source (12) and at least one light receptor (14) linearly spaced, creating a planar axis with the light source (12). A rotatable light director (16) is provided which includes means for directing light from the light source (12) to at least one optical aperture (22) in the light director (16). The optical aperture (22) refracts the directed light from the light director (16) to the light receptor (14). The optical rotary control (10) device further comprises an isolator portion (20) having recesses (24) for receiving and separating the light source (12) and light receptor (14). The means for directing light may include a cut out section (18) in one end of the light director (16).

20 Claims, 2 Drawing Sheets

OPTICAL CONTROL SWITCH DEVICE HAVING A PLURALITY OF LIGHT RECEPTORS

TECHNICAL FIELD

This invention relates generally to optical rotary control devices and more specifically to optical rotary control devices for radio frequency communication devices.

BACKGROUND INVENTION

Switches and other controls for electronic devices are typically discrete component assemblies requiring multiple parts. A higher number of parts generally requires an increase in the size of the device and the space required to house the device as well as the cost. Furthermore, with an increase in number of parts there is a decrease in reliability. Discrete controls with multiple parts are difficult to interconnect to an electronic device. The discrete controls require separate interconnections which must be made from the control component to the rest of the electronic device, usually contained on a PCB (printed circuit board). The interconnections require flex circuits, hand soldered joints and wire connections, all which increase the cost and size of the electronic device. These interconnections consume valuable space that is often premium in small electronic devices such as portable radios. Moreover, making these interconnections complicates the assembly process, and creates the possibility of quality problems caused by PCB contamination and contact failure. Discrete controls also utilize mechanical contacts to achieve the control function. Such contacts degrade with time and use resulting in an unreliable control device.

Optical control devices which are well known in the art, have typically required a multiple number of light sources and/or a multiple number of light receptors. At least one light receptor is required for each control state. Thus, such conventional optical devices require premium board space and are expensive. Furthermore, conventional optical devices have not provided absolute position indication upon start up. In other words, such conventional optical devices only give relative information from an unknown state. Alternatively, optical control devices that measure the intensity of reflected light to an optical receiver are also well known and are of the type disclosed in U.S. Pat. No. 4,964,693 to Branan et al. Such a device requires appropriate control circuitry capable of measuring the intensity of the reflected light.

More particularly, U.S. Pat. No. 3,610,941 to West teaches a program control system having a glass or plexiglass rod with circumferential grooves which refract light out to photoelectric cells. The rod is illuminated by a light source disposed at one end of the rod. The photoelectric cells are energized in a controlled sequence by luminous portions of the respective grooves as the rod rotates. Since the rod is illuminated at one end by a light source enough space must be provided in order to house the light source. Furthermore, since circumferential grooves are provided on the rod to refract the light out of the rod, a further step is required of opaquing the rod in areas where light should not be refracted in order not to excite the photoelectric cells when so desired.

Since consumers demand smaller and more reliable control devices, a need exists for a reliable optical switch, as an absolute position indicator, that can be easily manufactured and consume only a small portion of the apparatus in which it is contained.

SUMMARY OF THE INVENTION

Briefly, according to the invention, there is provided an optical rotary control device comprising a light source and at least one light receptor linearly spaced, creating a planar axis with the light source. A light director is provided which includes means for directing light from the light source to at least one optical aperture in the light director. The optical aperture refracts the directed light from the light director to the light receptor. The optical rotary control device further comprises an isolator portion having apertures for receiving and separating the light source and light receptor. The means for directing light may include a cut out section in one end of the light director.

In another embodiment, the light source and the light receptor may be mounted on a molded assembly piece, the molded assembly piece includes an integral means for receiving the light director.

DETAILED OF THE PREFERRED EMBODIMENT

Figure 2:
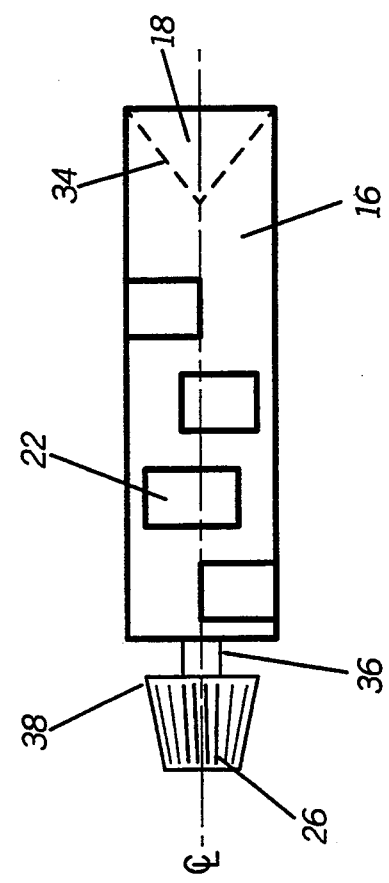
FIG. 2 is a top plan view of a light director according to the invention.

While the specification concludes with claims defining the features of the invention that are regarded as novel, it is believed that the invention will be better understood from a consideration of the following description in conjunction with the drawing figures, in which like reference numerals are carried forward.

Figure 1:
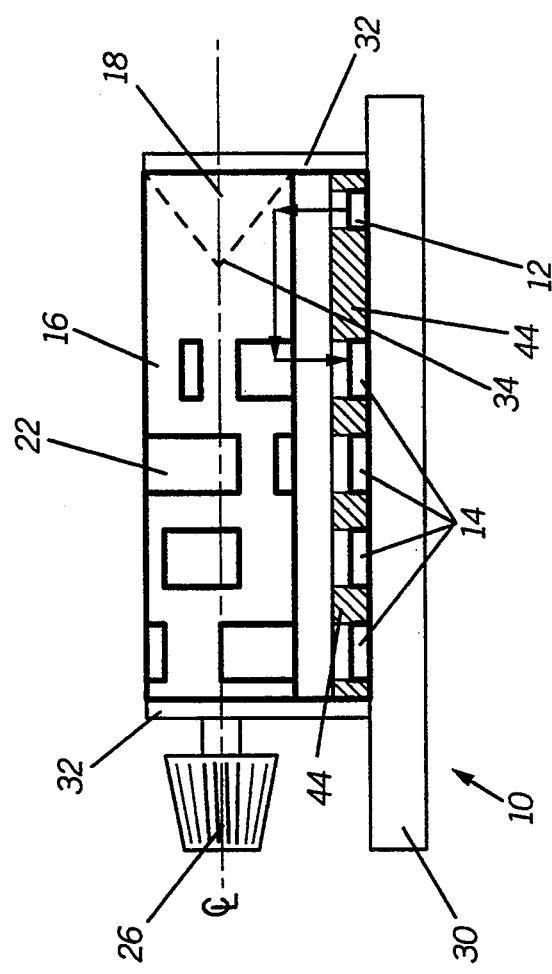
FIG. 1 is a side elevational view of an optical rotary control device according to the invention.

FIG. 1 shows a side elevational view of an optical rotary control device 10 according to the invention. The control device 10 includes a light director such as a light pipe 16 for directing light from a light source such as a light emitting diode (LED) 12 to at least one light receptor or phototransistor 14. The light pipe 16 may be a rod of plexiglass or any similar material which has the property of conducting light internally by internal reflection from one end to the other and appears dark on its cylindrical surface except where it is scratched or grooved.

The light pipe 16 includes a cut out section 18 at one end of the light pipe 16. The cut out section 18 directs light from a light source 12 down a longitudinal axis of the light pipe 16. In other words, the cut out section 18 refracts a concentrated amount of light internally through the light pipe 16. The cut out section 18 includes at least one wall 34 or surface that is disposed at an angle that is equal to or less than the critical angle of the material that the light pipe 16 is made from so that the light from the light source 12 is refracted down the light pipe 16. The cut out section 18 is shown as a cone but may be of any shape that would help refract the light internally along the longitudinal axis of the light pipe 16.

The light pipe 16 is spaced and rotatable above phototransistors 14 disposed on a circuit assembly 30 by two arms 32 or snap fit receptacles extending from the circuit assembly 30. The circuit assembly 30 may be a flexible circuit, a printed circuit board, or a molded circuit adapted for a radio housing. In a preferred embodiment there are four phototransistors 14 for receiving light that is refracted from the light pipe 16. The phototransistors 14 are arranged in a linear fashion on the circuit assembly 30. The light source 12 which is also disposed on the circuit assembly 30 is coplanar with the phototransistors 14 forming a linear axis with the phototransistors 14. The linear axis formed by the light source 12 and phototransistors 14 is parallel to the longitudinal axis of the light pipe 16. Space is saved by placing the light source 12 on the same circuit assembly 30 as the phototransistors 14. Opaque material 44 may surround each optical die device, i.e. phototransistors 14 and LED 12, to isolate each device and prevent ambient light from unintentionally exciting the phototransistors 14. Such opaque material 44 may be arranged to enhance the optic coupling between the phototransistors 14 and the LED 12.

FIG. 2 shows a top plan view of the light pipe 16 having optical apertures 22. A knob 26 is attached to one end of the light pipe 16 for rotating the light pipe 16. The light pipe 16 may include an indentation 36 or a means for attaching to the arms 32 for spacing the light pipe 16 from the circuit assembly 30 as well as a retaining means 38 for keeping the light pipe 16 aligned with the optical die devices.

The light pipe 16 is mirror polished except on the areas where it is desired to refract the light to the phototransistors 14. By simply roughing the surface of the light pipe 16 the light will be refracted out of the light pipe 16 to the phototransistors 14 depending on the placement of the roughed areas. The roughed areas act as optical apertures 22 for the light pipe 16 by refracting the internally reflected light out of the light pipe 16. The optical apertures 22 are arranged in a manner to produce a gray code, or binary coded decimal, output from the phototransistors 14 but may be arranged in any manner to produce any desired output.

Figure 3:
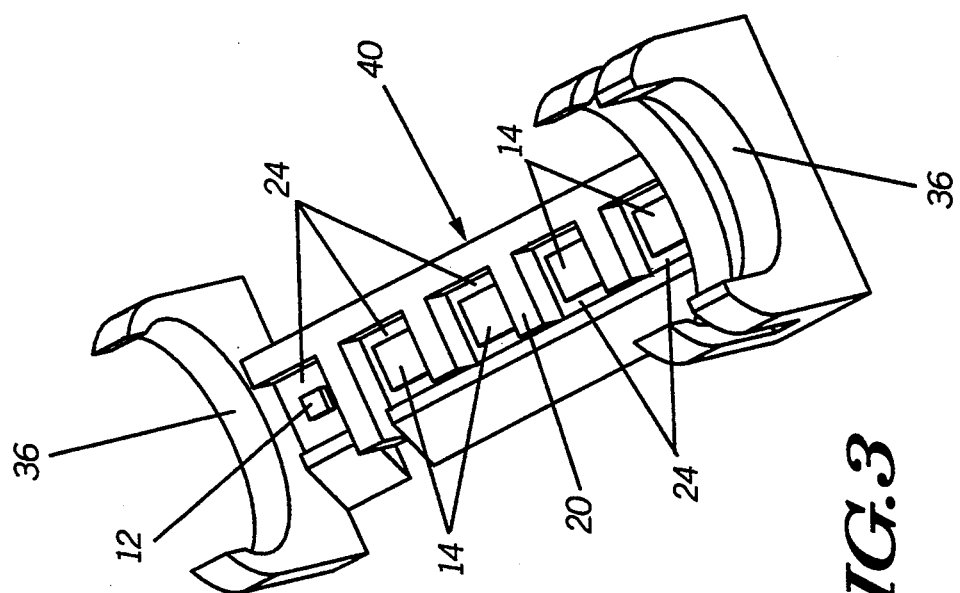
FIG. 3 is a isometric view of a mounting member according to the invention.

FIG. 3 shows an alternative embodiment of the isolator portion of the present invention. The isolator portion 20 of FIG. 3 is integral with extensions 36 for capturing the light pipe, thus forming a yoke 40. The yoke 40 may be separately molded and selectively metalized to form one part for attachment to a circuit assembly 30, i.e. a circuit carrier piece. The yoke 40 includes recesses 24 for receiving the optical die devices. The optical die devices are disposed within the recesses 24 of the isolator portion 20 of the yoke 40 as opposed to being attached directly on a printed circuit board or circuit assembly. The recesses 24 are cavities within the isolator portion 20 of the yoke so that when the optical die devices are set in the recesses 24 they are separated from one another and the isolator portion 20 effectively blocks ambient light from unintentionally exciting the phototransistors 14. The yoke 40 may include wire bonds for providing electrical connections to a circuit assembly, such as a printed circuit board or flexible circuit. A common transparent liquid epoxy or other suitable material covers the optical die devices and wire bonds as protective coating, such coveting may also enhance the optic coupling of the optical die device. The yoke 40 may be separately adhesively bonded to the circuit assembly 30. By having the light source 12, light receptors 14, isolator portion 20, and extensions 36, all on one yoke 40 for one piece part assembly to a circuit assembly, the number of discrete parts is drastically reduced.

In operation, the LED 12 conducts light to the light pipe 16 to be internally reflected. The light pipe 16 is spaced from the phototransistors 14 and rotatable so light may be directed to any number of the phototransistors 14. Output signals from the phototransistors 14 may be directly inputted to a microprocessor or decoding circuitry for a radio, or any electronic device. Thus, there can be any number of absolute output states depending upon the number of phototransistors 14 and the arrangement of the optical apertures 22 on the light pipe 16. The present invention outputs from the phototransistors 14 an absolute position control state dependent upon which phototransistors 14 in combination or alone are excited. Even upon start up, an absolute state or position can be determined by the output of the phototransistors 14. By simply rotating the knob 26 of the light pipe 16 an operator may select a desired output. The optical rotary control device of the present invention is simple and small enough for application in a portable radio environment to control operating parameters such as volume or channel select.

The present invention uses only a single moving part to achieve an optical rotary control device. Thus, a miniaturized optical rotary switch is provided that is reliable and small enough for applications in any device requiting a rotary control function in particular, portable and mobile radios.

While the invention has been particularly shown and described with reference to several preferred embodiments thereof, it will be understood by those skilled in the art that various changes in form and detail may be made without departing from the spirit or scope of the invention.

What is claimed is:

1. An optical control device comprising:
   a light source;
   a plurality of light receptors coplanarly disposed with said light source;
   a light director having a plurality of optical apertures arranged to selectively direct light to the plurality of light receptors, the light director having integrally formed means for directing light from said light source to the plurality of optical apertures in said light director.

2. The optical control device of claim 1 further comprising an isolator portion having apertures for receiving and separating said light source and light receptor.

3. The optical control device of claim 1 wherein said light source and said light receptor are mounted on a molded assembly piece, said molded assembly piece including an integral means for receiving said light director.

4. The optical rotary control device of claim 1, wherein the reflective surface is formed from a cut out section within the light director.

5. The optical control device of claim 1 wherein the light source and light receptor are mounted to an isolator potion that is selectively metallized and attachable to a circuit assembly.

6. An optical rotary control device comprising:
   a light source;
   at least one light receptor coplanarly disposed with said light source;
   a light director having means for directing light from said light source to at least one optical aperture in said light director wherein the means for directing light includes a cut out section in one end of the light director;

said optical aperture for refracting said directed light from the light director to said light receptor.

7. An optical control device comprising:

a light source mounted on a circuit assembly;

a plurality of light receptors coplanarly disposed on said circuit assembly from said light source;

a light director having a plurality of optical apertures arranged to selectively direct light to the plurality of light receptors, the light director having integrally formed means for directing light from said light source to the plurality of optical apertures in said light director.

8. The optical control device of claim 7 wherein said light source comprises a strobed light emitting diode.

9. The optical control device of claim 7 further comprising an opaque isolator portion having apertures that are linearly spaced and for mounting said light source and each light receptor on said circuit assembly within said apertures.

10. An optical control device comprising:

a light source mounted on a circuit assembly;

four light receptors linearly disposed on said circuit assembly forming a planar axis with said light source;

light director composed of a material that internally reflects light, said light director having a longitudinal axis and mounted on said circuit assembly so that said longitudinal axis is parallel to said planar axis formed by said light source and said light receptors, said light director having a cut out section in one end of said light director for reflecting light and directing said light internally within the light director;

at least one optical aperture for each light receptor for refracting said directed light from said light director to said light receptors.

11. The optical control device of claim 10 wherein an arrangement and number of apertures in said light director form a gray code.

12. The optical control device of claim 10 further comprising a plurality of optical apertures and a means for rotating that said light director so that sixteen different states may be detected from outputs of the light receptors.

13. The optical control device of claim 10 further comprising an isolator portion which separates each photo receptor and light source.

14. The optical control device of claim 10 wherein said light source is strobed.

15. The optical control device of claim 10 wherein said light director comprises a light pipe.

16. An optical rotary control device, comprising:

a light director being rotable along a rotation axis extending therethrough, the light director having plurality of optical apertures radially disposed from the rotation axis;

the light director having means for redirecting light originating from a light source radially disposed from the rotation axis of the light director to internally reflect within the light director;

the optical apertures being arranged to selectively direct the light from within the light director to a plurality of light receptors radially disposed from the rotation axis of the light director, when the light director is rotated.

17. The optical rotary control device of claim 16, wherein the light source and the plurality of light receptors are substantially coplanar.

18. The optical rotary control device of claim 16, wherein the means for redirecting light comprises a reflective surface formed within the light director.

19. The optical rotary control device of claim 18, wherein the reflective surface is formed to continuously redirect light from the light source as the light director is being rotated.

20. An optical rotary control device comprising:

a light source mounted on a circuit assembly;

at least one light receptor coplanarly disposed on said circuit assembly from said light source;

a light director having means for directing light from said light source to at least one optical aperture in said light director wherein the means for directing light comprises a cut out section in one end of the light director said optical aperture for refracting said directed light from the light director to said light receptor.

* * * * *